(12) United States Patent
Kim et al.

(10) Patent No.: US 10,361,177 B2
(45) Date of Patent: Jul. 23, 2019

(54) SEMICONDUCTOR PACKAGE HAVING A MOLDING LAYER INCLUDING A MOLDING CAVITY AND METHOD OF FABRICATING THE SAME

(71) Applicant: Samsung Electronics Co., Ltd., Suwon-si (KR)

(72) Inventors: Yun-Young Kim, Sejong-si (KR); Pyoungwan Kim, Suwon-si (KR); Hyunki Kim, Asan-si (KR); Junwoo Park, Suwon-si (KR); Sangsoo Kim, Cheonan-si (KR); Seung Hwan Kim, Asan-si (KR); Sung-Kyu Park, Cheonan-si (KR); Insup Shin, Seoul (KR)

(73) Assignee: SAMSUNG ELECTRONICS CO., LTD, Samsong-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/960,698

(22) Filed: Apr. 24, 2018

(65) Prior Publication Data
US 2019/0067258 A1    Feb. 28, 2019

(30) Foreign Application Priority Data
Aug. 28, 2017    (KR) .................. 10-2017-0108884

(51) Int. Cl.
*H01L 21/56* (2006.01)
*H01L 25/00* (2006.01)
(Continued)

(52) U.S. Cl.
CPC .......... *H01L 25/117* (2013.01); *H01L 21/561* (2013.01); *H01L 25/105* (2013.01); *H01L 25/50* (2013.01); *H01L 2224/16227* (2013.01); *H01L 2224/97* (2013.01); *H01L 2225/1023* (2013.01); *H01L 2225/1035* (2013.01); *H01L 2225/1041* (2013.01); *H01L 2225/1058* (2013.01); *H01L 2225/1076* (2013.01); *H01L 2225/1082* (2013.01); *H01L 2225/1094* (2013.01);
(Continued)

(58) Field of Classification Search
CPC .............. H01L 25/105; H01L 23/5385; H01L 23/49816; H01L 23/13; H01L 25/10; H01L 23/538; H01L 23/498; H01L 21/48; H01L 21/56
USPC ........ 257/686, 685, 777, 723, 778, 773, 774
See application file for complete search history.

(56) References Cited

U.S. PATENT DOCUMENTS

| 7,977,780 B2 | 7/2011 | Tay et al. |
| 7,994,626 B2 | 8/2011 | Pendse |

(Continued)

*Primary Examiner* — Alexander O Williams
(74) *Attorney, Agent, or Firm* — Muir Patent Law, PLLC

(57) ABSTRACT

Disclosed are a semiconductor package and a method of fabricating the same. The semiconductor package comprises a lower semiconductor chip on a lower substrate, a lower molding layer covering the lower semiconductor chip on the lower substrate and including a molding cavity that extends toward the lower semiconductor chip from a top surface of the lower molding layer, an interposer substrate on the top surface of the lower molding layer and including a substrate opening that penetrates the interposer substrate and overlaps the molding cavity, and an upper package on the interposer substrate. The molding cavity has a floor surface spaced apart from the upper package across a substantially hollow space.

20 Claims, 17 Drawing Sheets

(51) Int. Cl.
  *H01L 25/10* (2006.01)
  *H01L 25/11* (2006.01)
(52) U.S. Cl.
  CPC .............. *H01L 2924/15311* (2013.01); *H01L 2924/15331* (2013.01); *H01L 2924/1815* (2013.01); *H01L 2924/18161* (2013.01)

(56) References Cited

U.S. PATENT DOCUMENTS

| | | | |
|---|---|---|---|
| 8,034,660 B2 | 10/2011 | Takahashi | |
| 8,502,370 B2 | 8/2013 | Chan et al. | |
| 8,531,043 B2 | 9/2013 | Ha et al. | |
| 8,941,225 B2 | 1/2015 | Choi et al. | |
| 9,137,900 B2 | 9/2015 | Tanaka et al. | |
| 2011/0210444 A1* | 9/2011 | Jeng | H01L 23/13 257/738 |
| 2012/0159118 A1* | 6/2012 | Wong | H01L 25/105 712/1 |
| 2012/0241925 A1* | 9/2012 | Yoon | H01L 21/563 257/666 |
| 2013/0032388 A1* | 2/2013 | Lin | H01L 23/3121 174/261 |
| 2013/0256914 A1* | 10/2013 | Cheng | H01L 23/3114 257/777 |
| 2013/0337648 A1* | 12/2013 | Lin | H01L 21/486 438/675 |
| 2015/0115466 A1* | 4/2015 | Kim | H01L 23/28 257/774 |
| 2015/0123272 A1 | 5/2015 | Wu | |
| 2015/0348955 A1 | 12/2015 | Wu | |
| 2016/0043047 A1* | 2/2016 | Shim, II | H01L 21/561 257/773 |
| 2018/0145061 A1* | 5/2018 | Jeong | H01L 25/50 |
| 2018/0315740 A1* | 11/2018 | Im | H01L 23/3128 |
| 2018/0374833 A1* | 12/2018 | Wong | H01L 25/105 |

* cited by examiner

SEMICONDUCTOR PACKAGE HAVING A MOLDING LAYER INCLUDING A MOLDING CAVITY AND METHOD OF FABRICATING THE SAME

CROSS-REFERENCE TO RELATED APPLICATIONS

This U.S. nonprovisional patent application claims the benefit of priority under 35 U.S.C. § 119 of Korean Patent Application No. 10-2017-0108884, filed on Aug. 28, 2017, in the Korean Intellectual Property Office, the entire contents of which are hereby incorporated by reference.

BACKGROUND

The present disclosure relates to a semiconductor package and a method of fabricating the same.

The development of electronic industry may provide low price electronic products having characteristics such as light weight, compact size, high speed, and high performance. A compact-sized semiconductor package is provided to implement an integrated circuit chip to qualify for use in electronic products. Therefore, various research is required to enhance performance of the semiconductor package.

SUMMARY

Some embodiments of the present disclosure provide a semiconductor package having enhanced reliability and durability and a method of fabricating the same.

According to exemplary embodiments, a semiconductor package may comprise: a lower semiconductor chip on a lower substrate; a lower molding layer covering the lower semiconductor chip on the lower substrate, and the lower molding layer including a molding cavity that extends toward the lower semiconductor chip from a top surface of the lower molding layer; an interposer substrate on the top surface of the lower molding layer, the interposer substrate including a substrate opening that penetrates the interposer substrate and overlaps the molding cavity; and an upper package on the interposer substrate. A floor surface of the molding cavity may be spaced apart from the upper package across a substantially hollow space therebetween.

According to exemplary embodiments, a semiconductor package may comprise: a lower semiconductor chip on a lower substrate; a lower molding layer covering the lower semiconductor chip on the lower substrate, the lower molding including a molding cavity that extends toward the lower semiconductor chip from a top surface of the lower molding layer; and an interposer substrate on the lower molding layer, the interposer substrate including a substrate opening that penetrates the interposer substrate and overlaps the molding cavity. The molding cavity may have a floor surface spaced apart from the lower semiconductor chip.

According to exemplary embodiments, a method of fabricating a semiconductor package may comprise: mounting at least one lower semiconductor chip on a lower substrate; forming on the lower semiconductor chip an interposer substrate including a substrate opening that exposes the lower semiconductor chip; placing on the interposer substrate a mold including a protrusion that protrudes in a direction toward the substrate opening; and forming a lower molding layer between the lower substrate and the interposer substrate.

Details of other exemplary embodiments are included in the description and drawings.

DETAILED DESCRIPTION OF EMBODIMENTS

It will be herein discussed in detail the present concepts and their embodiments with reference to the accompanying drawings.

Figure 1:
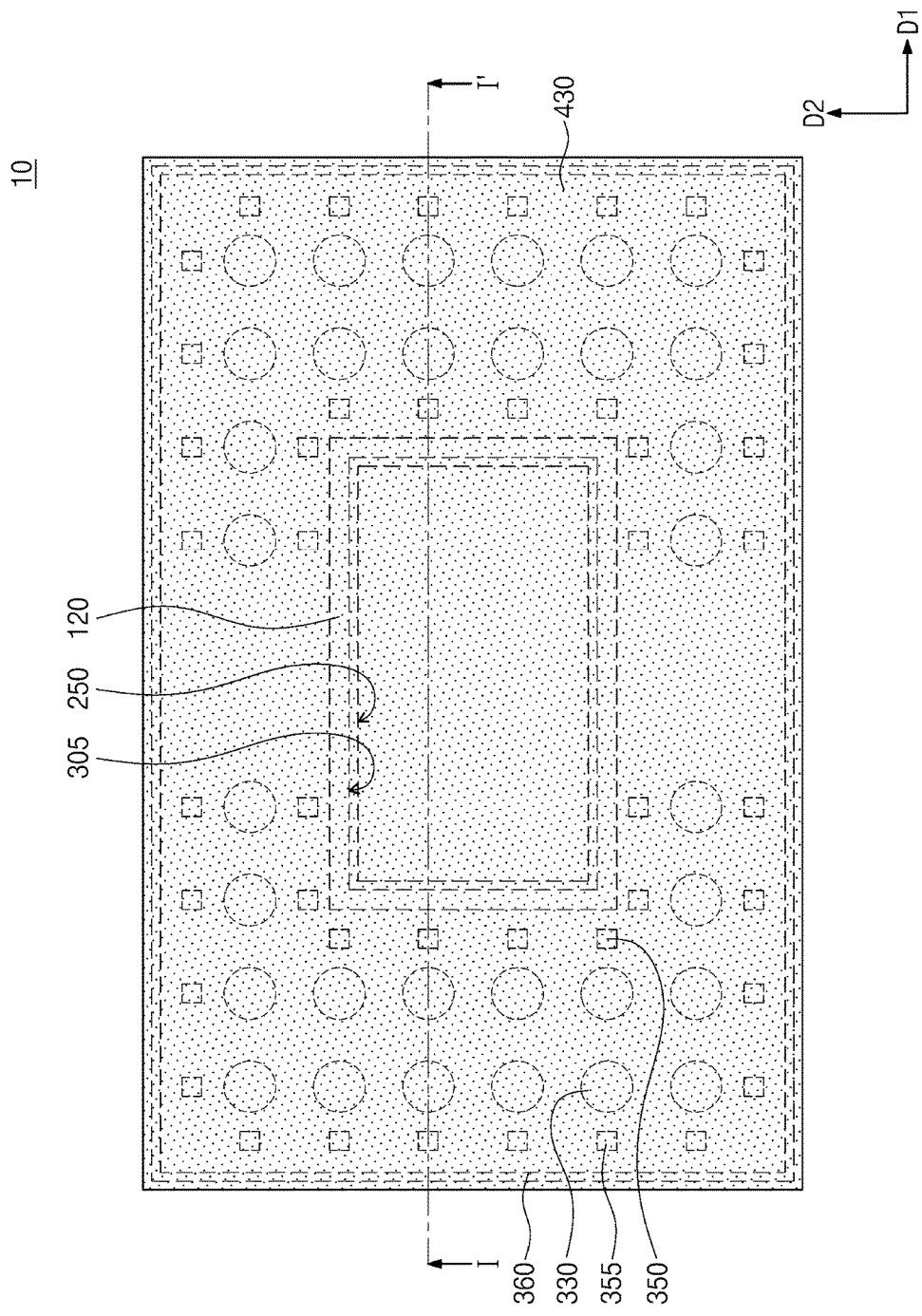
FIG. 1 illustrates a top plan view showing a semiconductor package, according to exemplary embodiments.
Figure 2:
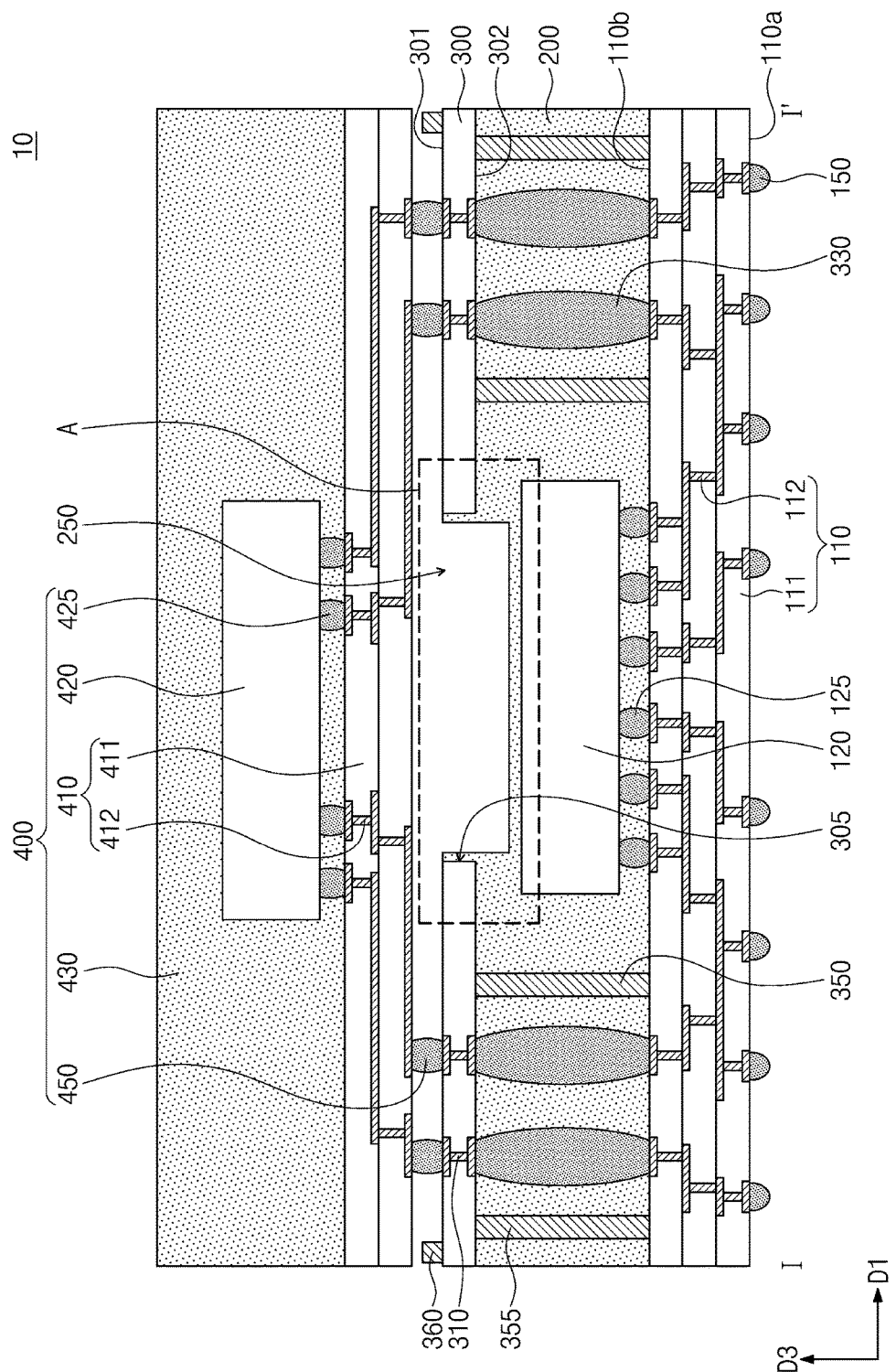
FIG. 2 illustrates a cross-sectional view taken along line I-I' of FIG. 1.
Figure 3:
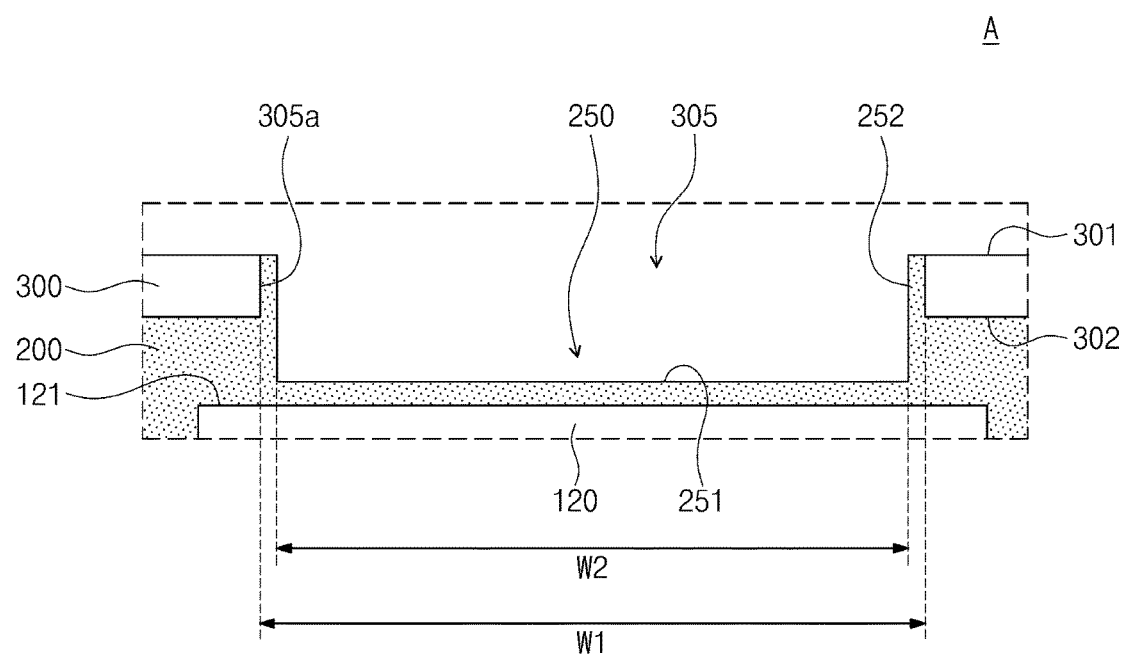
FIG. 3 illustrates an enlarged view showing section A of FIG. 2.

FIG. 1 illustrates a top plan view showing a semiconductor package, according to exemplary embodiments. FIG. 2 illustrates a cross-sectional view taken along line I-I' of FIG. 1. FIG. 3 illustrates an enlarged view showing section A of FIG. 2.

Referring to FIGS. 1 to 3, a semiconductor package 10 may include a lower package 110 and 120, an interposer substrate 300, and an upper package 400. The semiconductor package 10 may further include a lower molding layer 200, a lower conductive connection 330, a first lower supporter 350, a second lower supporter 355, and a barrier 360. The semiconductor package 10 may be fabricated at chip, panel, or wafer level.

The lower package 110 and 120 may include a lower substrate 110 and a lower semiconductor chip 120. The lower substrate 110 may be a printed circuit board (PCB), a silicon substrate, or a redistribution layer. The lower substrate 110 may have a small thickness. In an embodiment, the lower substrate 110 may include redistributed conductive patterns 112 and insulating layers 111. The redistributed conductive patterns 112 may include a conductive layer and a conductive via that are electrically connected to each other. The redistributed conductive patterns 112 may be disposed in the insulating layers 111. The lower substrate 110 may have a bottom surface 110a and a top surface 110b on opposite faces of the lower substrate 110.

External terminals 150 may be disposed on the bottom surface 110a of the lower substrate 110. The external terminals 150 may include a conductive material. In an embodiment, the external terminals 150 may be shaped like solder balls. The external terminals 150 may be electrically coupled to the redistributed conductive patterns 112 of the lower substrate 110. As used herein, items described as being "electrically connected" and/or "electrically coupled" are configured such that an electrical signal can be passed from one item to the other. Items that "electrically connected" and/or "electrically coupled" may include a direct connection/coupling or an indirect connection/coupling through other conductive component(s) (e.g., wires, pads, internal electrical lines, through vias, etc.).

The lower semiconductor chip 120 may be mounted on the top surface 110b of the lower substrate 110. The lower semiconductor chip 120 may include an integrated circuit, for example, a logic circuit. First contact terminals 125 may be provided on a bottom surface of the lower semiconductor chip 120. The first contact terminals 125 may be provided between the lower substrate 110 and the lower semiconductor chip 120. The first contact terminals 125 may include a conductive material such as metal. As such, the first contact terminals 125 may electrically connect the lower semiconductor chip 120 and the lower substrate 110 to each other. The first contact terminals 125 may have a solder ball shape, a bump shape, or a pillar shape.

The lower molding layer 200 may be provided on the top surface 110b of the lower substrate 110. In an embodiment, the lower molding layer 200 may cover the lower semiconductor chip 120. For example, the lower molding layer 200 may be provided on sidewalls of the lower semiconductor chip 120, in a space between the lower semiconductor chip 120 and the lower substrate 110, and on a top surface 121 of the lower semiconductor chip 120. The lower molding layer 200 may be provided on an inner sidewall of the interposer substrate 300. The inner sidewall of the interposer substrate 300 may be a sidewall 305a of a substrate opening 305, as discussed further below.

The lower molding layer 200 may include an insulating polymer material such as an epoxy molding compound. The lower molding layer 200 may have a molding cavity 250 that extends from a top surface of the lower molding layer 200 toward the top surface 121 of the lower semiconductor chip 120. In an embodiment, the molding cavity 250 may have a groove shape, but embodiments are not limited thereto. For example, the molding cavity 250 may have substantially vertical sides extending to a substantially horizontal floor surface. In an embodiment, the molding cavity 250 may be provided in a rectangular shape, when viewed in a plan view. In other embodiments, the molding cavity 250 may be provided in a circular or polygonal shape, when viewed in a plan view. The molding cavity 250 may be positioned above the lower semiconductor chip 120 and spaced apart from the lower semiconductor chip 120 in the third direction D3. The third direction D3 may be perpendicular to first and second directions D1 and D2, which are perpendicular to one another. The molding cavity 250 may vertically overlap at least a portion of the lower semiconductor chip 120.

The interposer substrate 300 may be formed on the lower molding layer 200. The interposer substrate 300 may be positioned between the upper package 400 and the lower package 100 and 120. For example, the interposer substrate 300 may be positioned between the lower molding layer 200 and an upper substrate 410, as discussed further below. The interposer substrate 300 may be a printed circuit board (PCB), a silicon substrate, or a redistribution layer. In an embodiment, the interposer substrate 300 may include redistributed conductive patterns 310. The redistributed conductive patterns 310 each may include a conductive layer, a via, and a pad that are electrically connected to each other. The interposer substrate 300 may have a top surface 301 and a bottom surface 302 on opposite faces of the interposer substrate 300. The top surface 301 of the interposer substrate 300 may face the upper package 400, and the bottom surface 302 of the interposer substrate 300 may face the lower substrate 110. In some embodiments, the bottom surface 302 of the interposer substrate 300 may face and contact a top surface of the lower molding layer 200. Components described herein as "contacting" each other, or "in contact with" each other, are directly connected together, without intervening elements (e.g., are touching).

The interposer substrate 300 may include a substrate opening 305 penetrating therethrough. In one exemplary embodiment, the substrate opening 305 may be provided in a rectangular shape, when viewed in a plan view. In other embodiments, the substrate opening 305 may be provided in a circular or polygonal shape, when viewed in a plan view. The substrate opening 305 may have a shape corresponding to that of the molding cavity 250. The substrate opening 305 may overlap the molding cavity 250. The substrate opening 305 may have a width W1 greater than a width W2 of the molding cavity 250. For example, when viewed in a plan view, the molding cavity 250 may be positioned in the substrate opening 305. The lower molding layer 200 may be provided on a sidewall 305a of the substrate opening 305. In such a configuration, the inner sidewall of the interposer substrate 300 may be externally exposed but protected by the lower molding layer 200.

The molding cavity 250 may have a floor surface 251 spaced apart from the top surface 121 of the lower semiconductor chip 120. A distance between the floor surface 251 of the molding cavity 250 and the top surface 121 of the lower semiconductor chip 120 may be less than a distance between the bottom surface 302 of the interposer substrate 300 and the top surface 121 of the lower semiconductor chip 120. In some embodiments, the lower molding layer 200 may extend in the space between the floor surface 251 of the molding cavity 250 and the top surface 121 of the lower semiconductor chip 120. The molding cavity 250 may have a sidewall 252 spaced apart from the sidewall 305a of the substrate opening 305. The molding cavity 250 may be a substantially hollow space. For example, the floor surface 251 of the molding cavity 250 may be spaced apart from the upper package 400 across the substantially hollow space. In this description, the phrase "substantially hollow space" may indicate a space not filled with solid, liquid, and so forth, except for gas. Heat generated from the lower semiconductor chip 120 may be discharged through the molding cavity 250. Accordingly, the semiconductor package 10 may have enhanced heat dissipation. The molding cavity 250 may have a height greater than that of the substrate opening 305. In this description, the term "height" may denote a length in the third direction D3.

For example, the height of the molding cavity 250 may be a vertical length between top and bottom ends of the sidewall 252 of the molding cavity 250. The bottom end of the sidewall 252 of the molding cavity 250 may be connected to the floor surface 251 of the molding cavity 250, and the top end of the sidewall 252 of the molding cavity 250 may be on the same plane on which the top surface 301 of the interposer substrate 300 is located. For example, the bottom end of the sidewall 252 may terminate at the intersection of the sidewall 252 and the floor surface 251 of the molding cavity 250, and the top end of the sidewall 252 may terminate at intersection of the sidewall 252 and the plane on which the top surface 301 is located. The height of the substrate opening 305 may be a vertical length between the top and bottom surfaces 301 and 302 of the interposer substrate 300.

The lower conductive connection 330 may be disposed in the lower molding layer 200. The lower conductive connection 330 may be positioned between the lower substrate 110 and the interposer substrate 300. The lower conductive connection 330 may be laterally spaced apart from the lower semiconductor chip 120. The first and second directions D1 and D2 may be parallel to the top surface 110b of the lower substrate 110. The first and second directions D1 and D2 may be perpendicular to each other. As used herein, the terms "laterally disposed" and/or "laterally spaced" may mean disposed/spaced in parallel along the first direction D1 and/or the second direction D2. When items are described as "laterally disposed apart" and/or "laterally spaced apart," they are horizontally separated from one another.

The lower conductive connection 330 may include a conductive material such as metal. The lower conductive connection 330 may electrically connect the lower substrate 110 and the interposer substrate 300 to each other. For example, the lower conductive connection 330 may be electrically connected to the redistributed conductive patterns 112 of the lower substrate 110 and to the redistributed conductive patterns 310 of the interposer substrate 300. In an embodiment, the lower conductive connection 330 may be a joint ball, but embodiments are not limited thereto.

The first lower supporter 350 may be provided beneath the bottom surface 302 of the interposer substrate 300. The first lower supporter 350 may be disposed in the lower molding layer 200. The first lower supporter 350 may be positioned between the lower substrate 110 and the interposer substrate 300. The first lower supporter 350 may connect the lower substrate 110 and the interposer substrate 300 to each other. The first lower supporter 350 may be positioned between the lower conductive connection 330 and the lower semiconductor chip 120.

The second lower supporter 355 may be provided beneath the bottom surface 302 of the interposer substrate 300. The second lower supporter 355 may be laterally spaced apart from the first lower supporter 350 and/or the lower conductive connection 330. The lower conductive connection 330 may be positioned between the first lower supporter 350 and the second lower supporter 355. The second lower supporter 355 may be disposed in the lower molding layer 200. The second lower supporter 355 may connect the lower substrate 110 and the interposer substrate 300 to each other.

The first lower supporter 350 and the second lower supporter 355 each may have substantially vertical sidewalls continuously extending from the bottom surface 302 of the interposer substrate 300 to the top surface 110b of the lower substrate 110. The first and second lower supporters 350 and 355 may maintain a constant spacing distance between the interposer substrate 300 and the lower substrate 110.

In an embodiment, the first and second lower supporters 350 and 355 may have a pillar shape, but embodiments are not limited thereto. The first and second lower supporters 350 and 355 may include a solder resist material. For example, the first and second lower supporters 350 and 355 may include an epoxy material.

The solder resist material, or other material that forms the first and second lower supporters 350 and 355, may have a melting point greater than that of a conductive material of the lower conductive connection 330. The first and second lower supporters 350 and 355 may protrude toward the lower substrate 110 from the bottom surface 302 of the interposer substrate 300.

The barrier 360 may be provided on the top surface 301 of the interposer substrate 300. The barrier 360 may be positioned between the interposer substrate 300 and the upper package 400. The barrier 360 may be vertically spaced apart from the upper package 400 in the D3 direction. The barrier 360 may protrude toward the upper package 400 from the top surface 301 of the interposer substrate 300. The barrier 360 may form a rail, or lip, or outer wall on the top surface 301 of the interposer substrate 300. The barrier 360 may have a protruding length (see L of FIG. 10) less than those of the first and second lower supporters 350 and 355 (see L1 and L2 of FIG. 10). The barrier 360 may be laterally spaced apart from an upper conductive connection 450, as discussed further below. The barrier 360 may be placed close to an edge of the interposer substrate 300. For example, the barrier 360 may be placed in proximity to a perimeter of the interposer substrate 300. The barrier 360 will be discussed below in detail with reference to FIG. 5.

The upper package 400 may be mounted on the interposer substrate 300. The upper package 400 may include an upper substrate 410, an upper semiconductor chip 420, and an upper molding layer 430. The upper package 400 may further include an upper conductive connection 450. The upper conductive connection 450 may be positioned between the barrier 360 and the substrate opening 305.

The upper substrate 410 may be positioned over the top surface 301 of the interposer substrate 300. The upper substrate 410 may be a printed circuit board (PCB), a silicon substrate, or a redistribution layer. In an embodiment, the upper substrate 410 may include insulating layers 411 and redistributed conductive patterns 412. The redistributed conductive patterns 412 each may include a conductive layer, a via, and a pad that are electrically connected to each other. The redistributed conductive patterns 412 may be disposed in the insulating layers 411.

The upper semiconductor chip 420 may be mounted on a top surface of the upper substrate 410. The upper semiconductor chip 420 may include an integrated circuit, for example, a memory circuit. Second contact terminals 425 may be provided in a gap between the upper substrate 410 and the upper semiconductor chip 420. In an embodiment, the second contact terminals 425 may have a bump shape, a solder ball shape, or a pillar shape. In other embodiments, the second contact terminals 425 may be bonding wires provided on the top surface of the upper semiconductor chip 420. The second contact terminals 425 may include a conductive material such as metal. As such, the second contact terminals 425 may electrically connect the upper semiconductor chip 420 and the upper substrate 410 to each other. The upper molding layer 430 may be provided on the top surface of the upper substrate 410. In an embodiment, the upper molding layer 430 may cover the upper semiconductor chip 420. For example, the upper molding layer 430 may cover a top surface of the upper semiconductor chip 420, side surfaces of the upper semiconductor chip 420, and a bottom surface of the upper semiconductor chip 420 between the second contact terminals 425.

The upper conductive connections 450 may be disposed on a bottom surface of the upper substrate 410. The upper conductive connections 450 may be positioned between the upper substrate 410 and the interposer substrate 300. The upper conductive connections 450 may include a conductive material. In an embodiment, the upper conductive connections 450 may have a solder ball shape. The upper conductive connections 450 may electrically connect the upper substrate 410 and the interposer substrate 300 to each other. For example, the upper conductive connections 450 may be electrically connected to the redistributed conductive patterns 412 of the upper substrate 410 and to the redistributed conductive patterns 310 of the interposer substrate 300. The upper conductive connections 450 may vertically overlap the lower conductive connections 330. The upper conductive connections 450 may vertically overlap the upper molding layer 430. The upper conductive connections 450 may be laterally spaced apart from the substrate opening 305.

Accordingly, the upper conductive connections 450 may not overlap the substrate opening 305.

Figure 4:
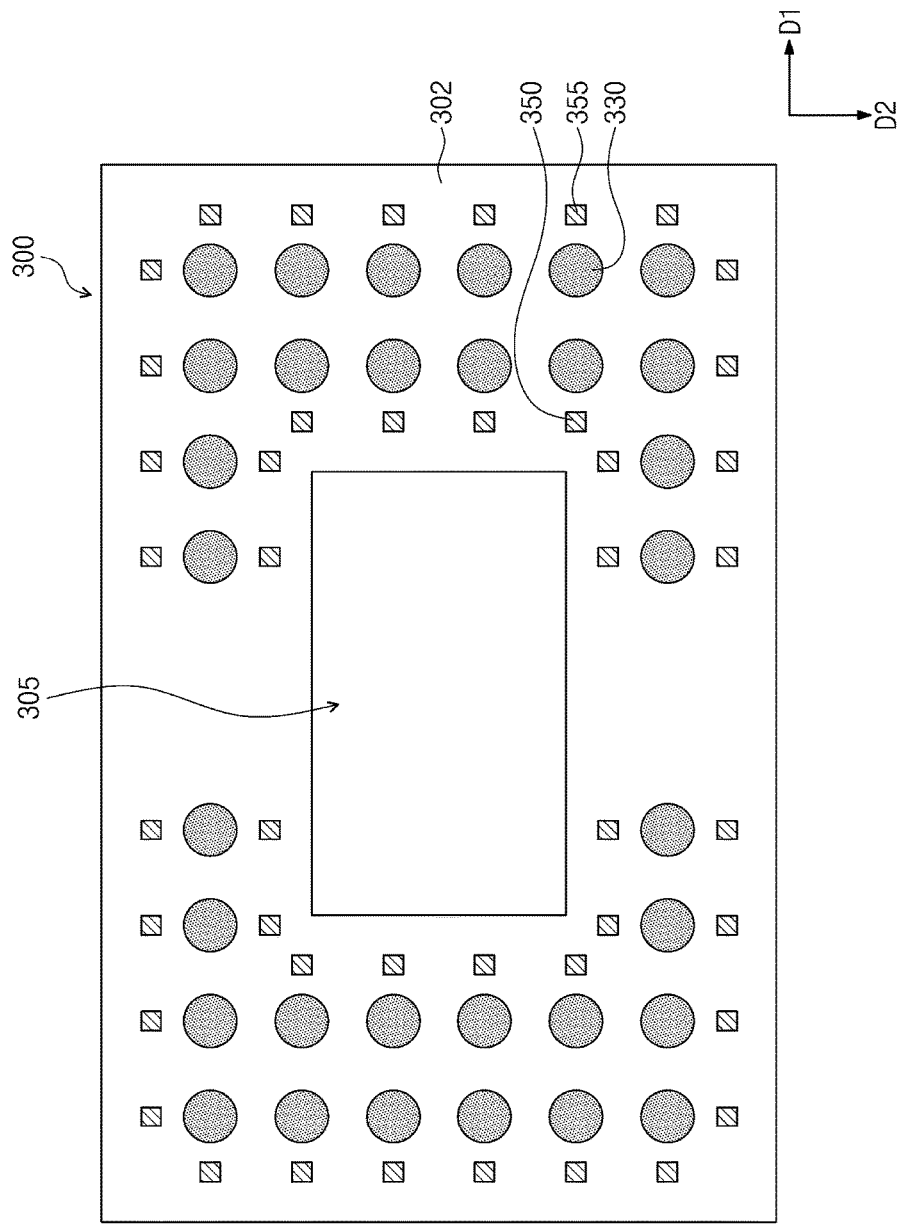
FIG. 4 illustrates a bottom plan view showing an interposer substrate of FIG. 2.
Figure 5:
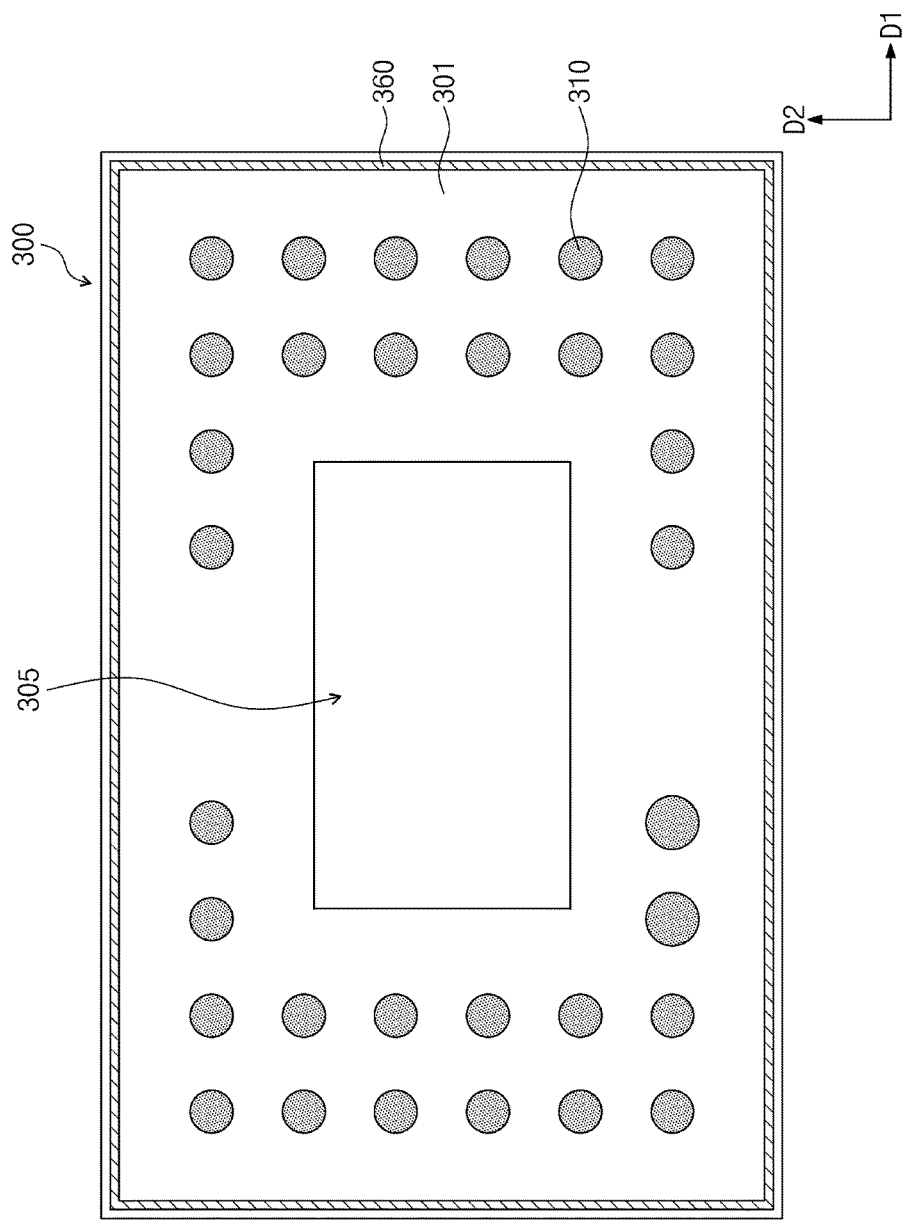
FIG. 5 illustrates a top plan view showing an interposer substrate of FIG. 2.

FIG. 4 illustrates a bottom plan view showing the interposer substrate 300 of FIG. 2. FIG. 5 illustrates a top plan view showing the interposer substrate 300 of FIG. 2.

Referring to FIGS. 1, 4, and 5, the barrier 360 may be provided on the top surface 301 of the interposer substrate 300. The barrier 360 may extend along the edge of the interposer substrate 300. The barrier 360 may surround the substrate opening 305. For example, the barrier 360 may be formed along the entire edge of the interposer substrate 300, forming an outside boundary around the substrate opening 305. The barrier 360 may be formed of an insulative material.

The bottom surface 302 of the interposer substrate 300 may be provided thereon with the first lower supporter 350, the second lower supporter 355, and the lower conductive connection 330.

The first lower supporter 350 may be provided in plural. In an embodiment, when viewed in a plan view, the first lower supporters 350 may be arranged at an equal distance along the first direction D1 and in the second direction D2. Hence, spaces may be formed between adjacent ones of the first lower supporters 350. The first lower supporters 350 may surround at least a portion of the substrate opening 305. The first lower supporters 350 may surround at least a portion of the lower semiconductor chip (see 120 of FIG. 1). Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

The second lower supporter 355 may be provided in plural. In an embodiment, when viewed in a plan view, the second lower supporters 355 may be arranged at an equal distance along the first direction D1 and/or the second direction D2. Hence, spaces may be formed between adjacent ones of the second lower supporters 355. The second lower supporters 355 may surround at least a portion of the substrate opening 305. The second lower supporters 355 may surround at least a portion of the lower semiconductor chip 120.

The lower conductive connection 330 may be positioned between the first lower supporter 350 and the second lower supporter 355. The lower conductive connection 330 may be provided in plural. When viewed in a plan view, the lower conductive connections 330 may be arranged along the first direction D1 and/or the second direction D2. The arrangement of the lower conductive connections 330 may correspond to that of the redistributed conductive patterns 310 of the interposer substrate 300. In an embodiment, when viewed in a plan view, the redistributed conductive patterns 310 of the interposer substrate 300 may be arranged along the first direction D1 and/or the second direction D2. For example, there may be a one-to-one correspondence of the redistributed conductive patterns 310 and the lower conductive connections 330, and a layout of the redistributed conductive patterns 310 of the interposer substrate 300 may be similar to that of the lower conductive connections 330.

Figure 6:
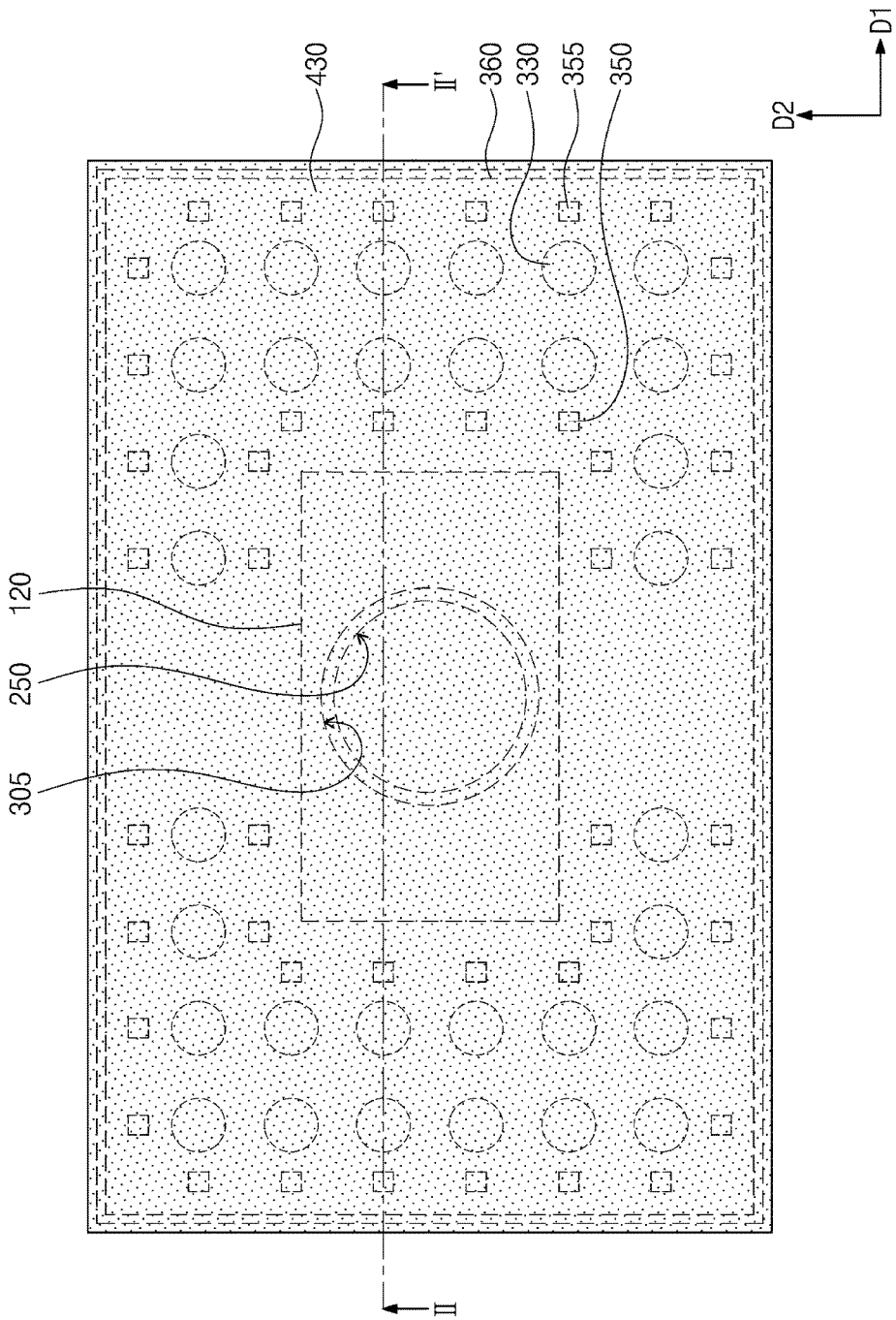
FIG. 6 illustrates a top plan view showing a semiconductor package, according to exemplary embodiments.
Figure 7:
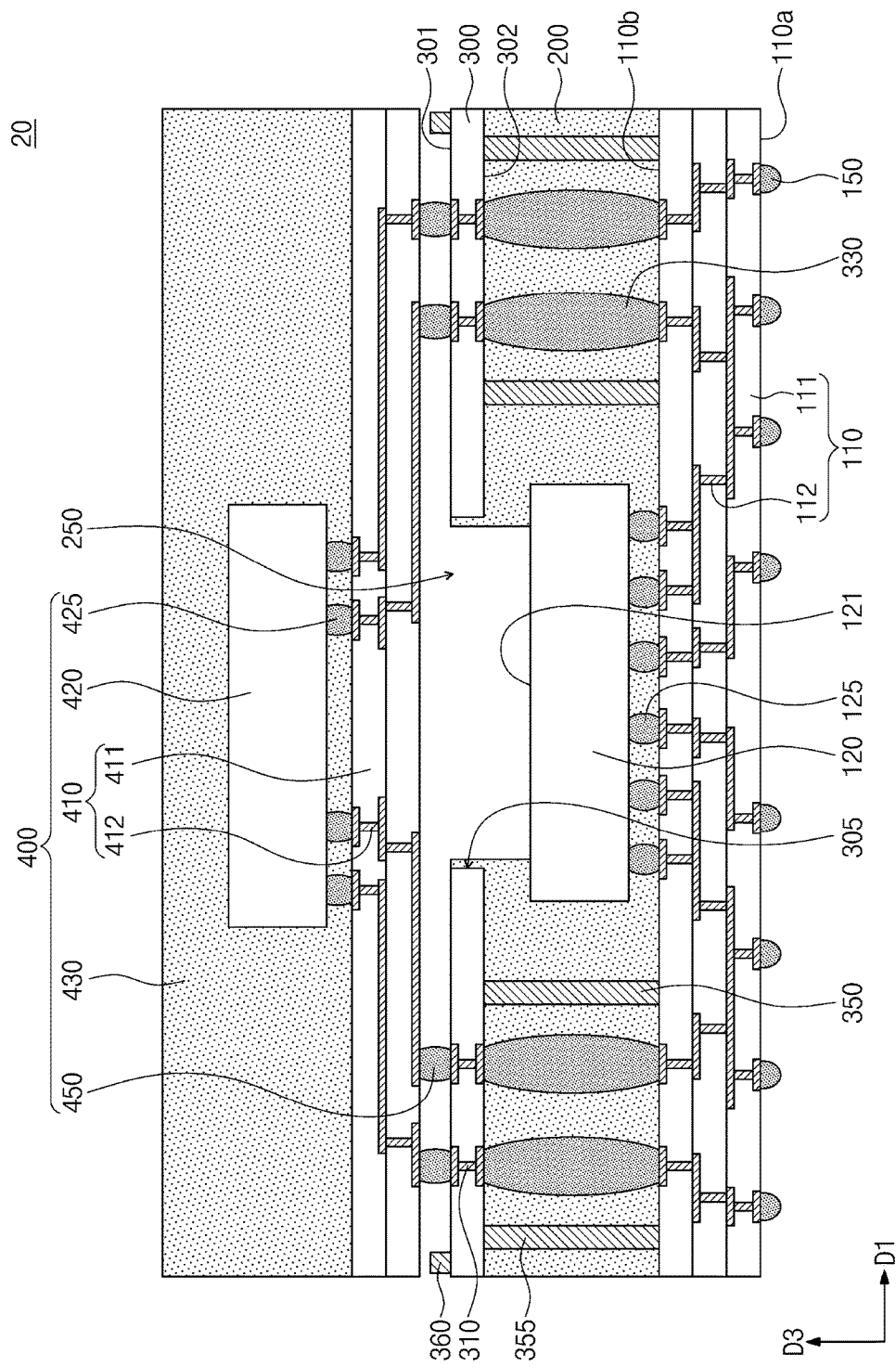
FIG. 7 illustrates a cross-sectional view taken along line II-II' of FIG. 6.

FIG. 6 illustrates a top plan view showing a semiconductor package, according to exemplary embodiments. FIG. 7 illustrates a cross-sectional view taken along line II-II' of FIG. 6. In the embodiments that follow, components substantially the same as those of the embodiments discussed with reference to FIGS. 1 to 5 are omitted or abbreviated for brevity of description.

Referring to FIGS. 6 to 7, a semiconductor package 20 may include a lower package 110 and 120, an interposer substrate 300, and an upper package 400. The semiconductor package 20 may further include a lower molding layer 200, a lower conductive connection 330, a first lower supporter 350, a second lower supporter 355, and a barrier 360.

The lower package 110 and 120 may include a lower substrate 110 and a lower semiconductor chip 120. External terminals 150 may be disposed on a bottom surface 110a of the lower substrate 110. The upper package 400 may include an upper substrate 410, an upper semiconductor chip 420, and an upper molding layer 430.

The interposer substrate 300 may be positioned between the lower molding layer 200 and the upper package 400. The interposer substrate 300 may include a substrate opening 305 penetrating therethrough. In an embodiment, the substrate opening 305 may be provided in a circular shape, when viewed in a plan view.

The lower molding layer 200 may have a molding cavity 250 that extends from a top surface of the lower molding layer 200 toward the lower semiconductor chip 120. The molding cavity 250 may be provided in a circular shape, when viewed in a plan view. The molding cavity 250 may be positioned in the substrate opening 305, when viewed in a plan view. The molding cavity 250 may expose a top surface 121 of the lower semiconductor chip 120. The molding cavity 250 may be a hollow space.

FIGS. 8 to 16 illustrate cross-sectional views showing a method of fabricating a semiconductor package, according to exemplary embodiments. FIG. 17 illustrates an enlarged view showing section B of FIG. 14. In the embodiments that follow, components substantially the same as those of the embodiments discussed with reference to FIGS. 1 to 5 are omitted or abbreviated for brevity of description.

Figure 8:
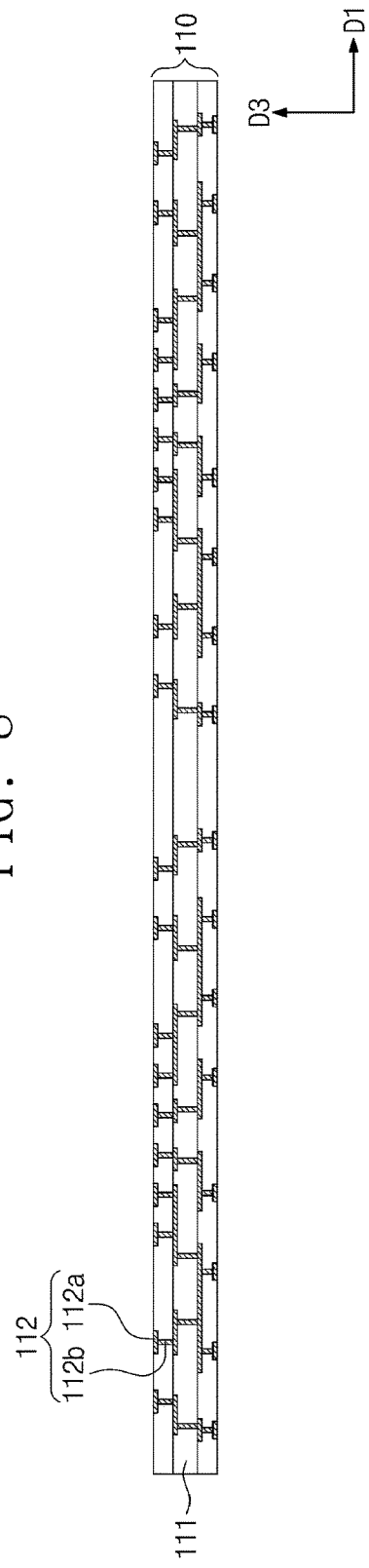
FIGS. 8 to 17 illustrate cross-sectional views showing a method of fabricating a semiconductor package, according to exemplary embodiments.

Referring to FIG. 8, a lower substrate 110 may be prepared to include redistributed conductive patterns 112 and a plurality of insulating layers 111. The redistributed conductive patterns 112 may include a conductive pattern 112a between the insulating layers 111 and a conductive via 112b penetrating the insulating layers 111. The lower substrate 110 may be formed at a panel or wafer level.

Figure 9:
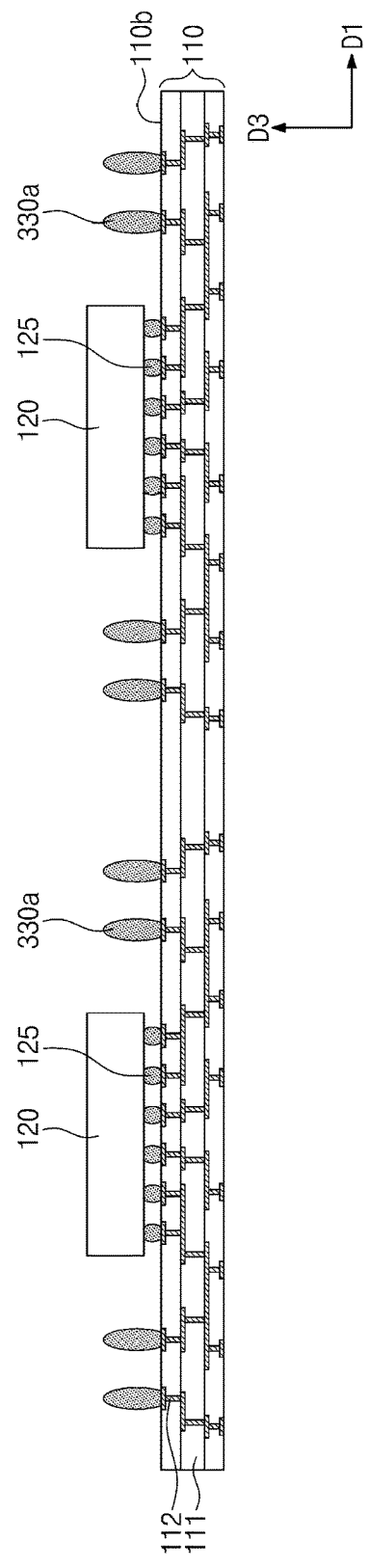

Referring to FIG. 9, a plurality of lower semiconductor chips 120 may be mounted on a top surface 110b of the lower substrate 110. For example, the lower semiconductor chip 120 may include first contact terminals 125 electrically connected to the redistributed conductive patterns 112 of the lower substrate 110. The lower semiconductor chips 120 may have their various numbers, mounting methods, and arrangements. In an embodiment, when viewed in a plan view, the lower semiconductor chips 120 may be arranged along one or more of first and second directions (see D1 and D2 of FIG. 1) on the top surface 110b of the lower substrate 110.

Lower connection terminals 330a may be formed on the top surface 110b of the lower substrate 110. For example, the lower connection terminals 330a may be formed on the redistributed conductive patterns 112 of the lower substrate 110. The lower connection terminals 330a may be laterally spaced apart from the lower semiconductor chip 120. The lower connection terminals 330a may at least partially surround each of the lower semiconductor chips 120.

Figure 10:
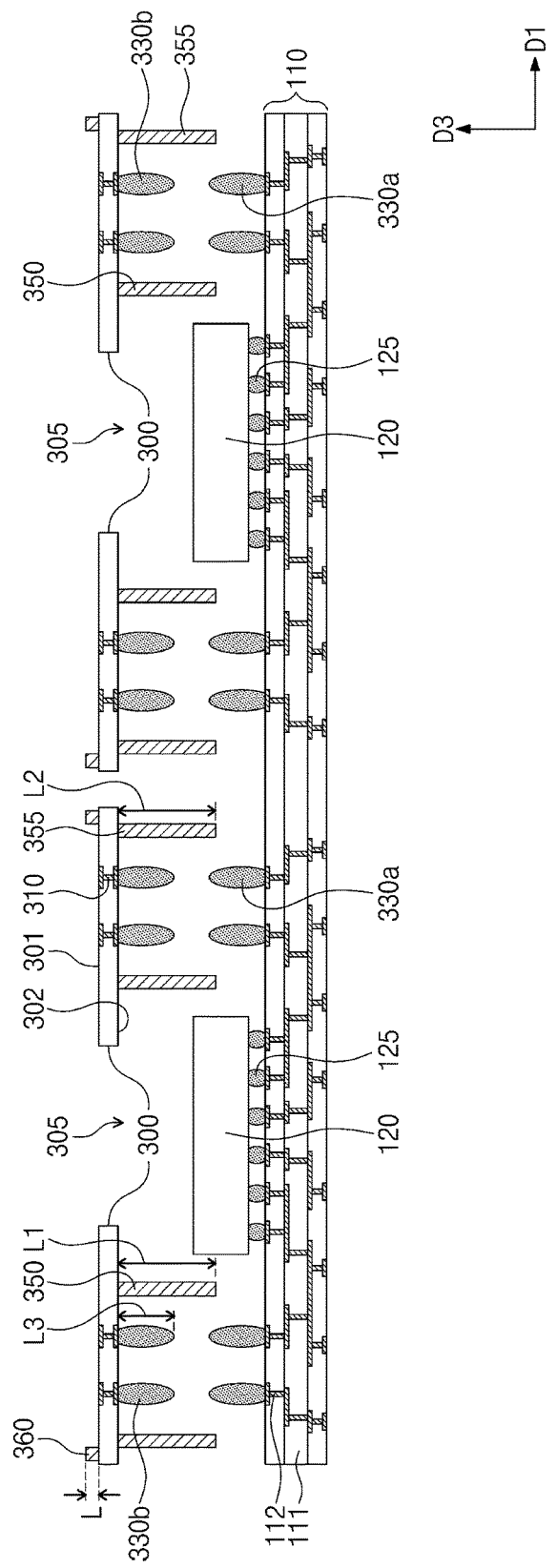

Referring to FIG. 10, a plurality of interposer substrates 300 may be aligned over the lower substrate 110 on which the lower semiconductor chips 120 are mounted. The interposer substrates 300 may be spaced apart from each other at a distance corresponding to a substrate opening 305 through which the lower semiconductor chip 120 is exposed. For example, the interposer substrates 300 may be positioned over the lower substrate 110 so as to cause the substrate opening 305 to vertically overlap the lower semiconductor chip 120. The interposer substrates 300 may be positioned over corresponding lower semiconductor chips 120. In some embodiments, the interposer substrates 300 may be positioned such that a center point of each of the substrate openings 305 is aligned with a center point of a corresponding one of the lower semiconductor chips 120. The interposer substrates 300 may be spaced apart from the lower semiconductor chips 120 in a third direction D3. In other embodiments, the interposer substrates 300 may be formed into a single body.

The interposer substrate 300 may be provided on its bottom surface 302 with a plurality of upper connection terminals 330b vertically aligned with the lower connection terminals 330a on the lower substrate 110. For example, the upper connection terminals 330b and the lower connection terminals 330a may vertically overlap each other. The upper connection terminals 330b may be electrically connected to redistributed conductive patterns 310 of the interposer substrate 300.

The upper connection terminals 330b may protrude toward the lower substrate 110 from the bottom surface 302 of the interposer substrate 300. In an embodiment, the upper connection terminals 330b may have a protruding length L3 less than a protruding length L1 of a first lower supporter 350 and a protruding length L2 of a second lower supporter 355. The first and second lower supporters 350 and 355 may be provided on the bottom surface 302 of the interposer substrate 300, and may protrude toward the lower substrate 110. In other embodiments, the protruding length L3 of each upper connection terminal 330b may be substantially the same as the protruding length L1 of the first lower supporter 350 and the protruding length L2 of the second lower supporter 355. A barrier 360 may be provided extending along an edge of a top surface 301 of the interposer substrate 300, and may have a protruding length L less than the protruding lengths L1 and L2 of the first and second lower supporters 350 and 355.

The first lower supporter 350 may be aligned between the lower connection terminals 330a and the lower semiconductor chip 120. The second lower supporter 355 may be aligned with the lower connection terminals 330a.

Figure 11:
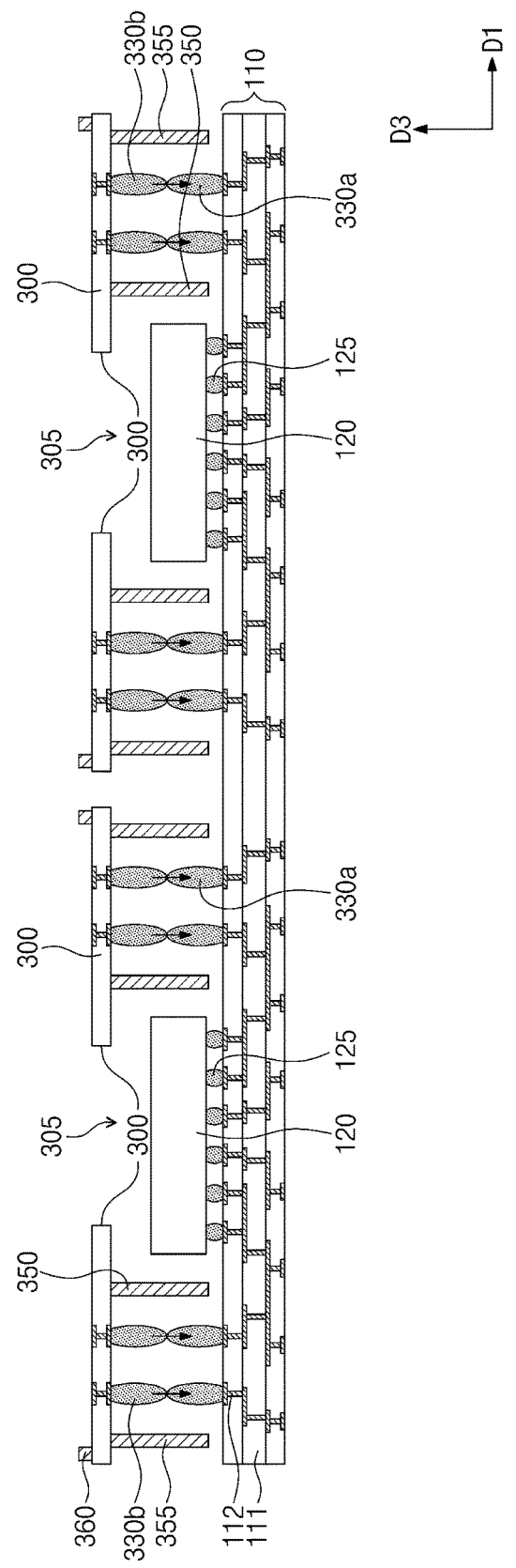

Referring to FIG. 11, one of the interposer substrate 300 and the lower substrate 110 may move to come close to the other of the interposer substrate 300 and the lower substrate 110. In an embodiment, the interposer substrate 300 may move toward the lower substrate 110 so that the interposer substrate 300 and the lower substrate 110 may be brought in closer proximity to each other. Accordingly, the upper connection terminals 330b may be in contact with the lower connection terminals 330a.

When one or both of the interposer substrate 300 and the lower substrate 110 move to come close to each other, the first and second lower supporters 350 and 355 may become in contact with the lower substrate 110. When the first and second lower supporters 350 and 355 are in contact with the lower substrate 110, the upper connection terminals 330b may be in contact with the lower connection terminals 330a or may compress the upper connection terminals 330b and/or the lower connection terminals 330a at a predetermine pressure.

As the first and second lower supporters 350 and 355 are in contact with the lower substrate 110, the interposer substrate 300 may be restricted from further movement toward the lower substrate 110. It therefore may be possible to prevent the upper and lower connection terminals 330b and 330a from displacement due to excessive compression therebetween. The first and second lower supporters 350 and 355 may assist to allow the upper and lower connection terminals 330b and 330a to vertically align with each other. For example, the upper connection terminals 330b may be aligned to lie between the first and second lower supporters 350 and 355. Accordingly, the upper and lower connection terminals 330b and 330a may be vertically aligned with each other.

Figure 12:
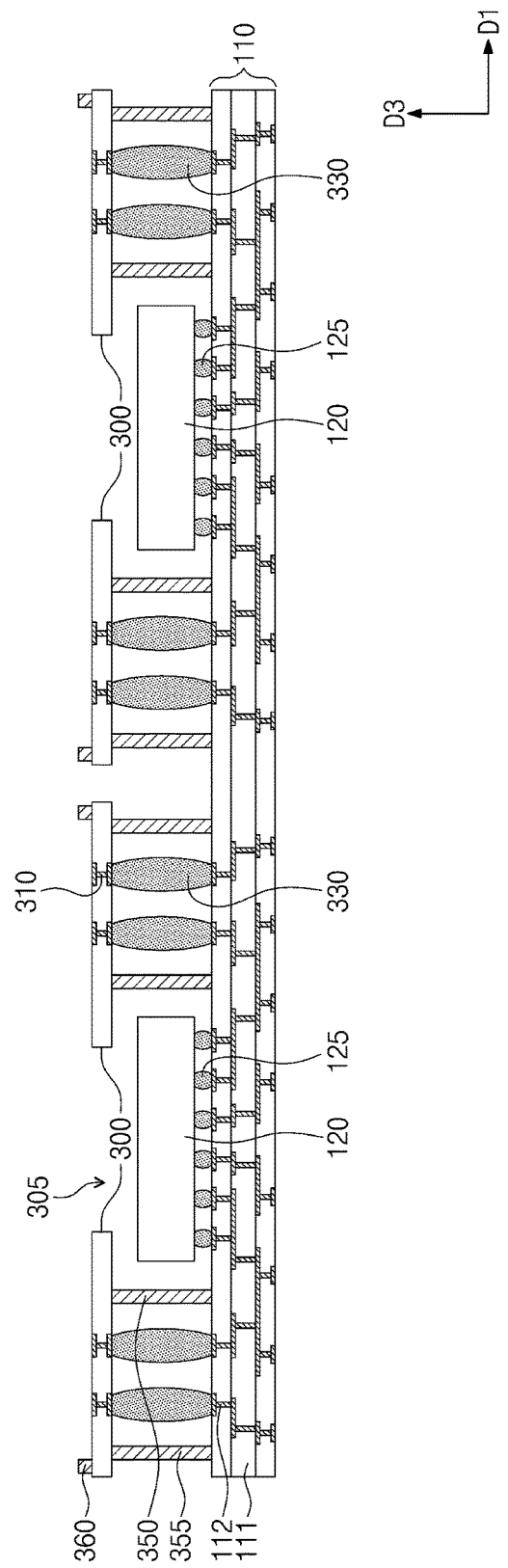

Referring to FIG. 12, a lower conductive connection 330 may be formed. For example, a reflow process may be performed to join the upper connection terminals 330b with the lower connection terminals 330a. As such, the reflow process may form the lower conductive connection 330. The reflow process may performed at a temperature the same as or higher than melting points of the upper and lower connection terminals 330b and 330a. For example, the reflow process may be performed at a temperature of less than about 450° C., and more particularly from about 170° C. to about 230° C. When the reflow process is performed, no melting may occur in the first and second lower supporters 350 and 355, the redistributed conductive patterns 112 of the lower substrate 110, and the redistributed conductive patterns 310 of the interposer substrate 300. Thus, the reflow process may not damage the first and second lower supporters 350 and 355, the redistributed conductive patterns 112 of the lower substrate 110, and the redistributed conductive patterns 310 of the interposer substrate 300.

Figure 13:
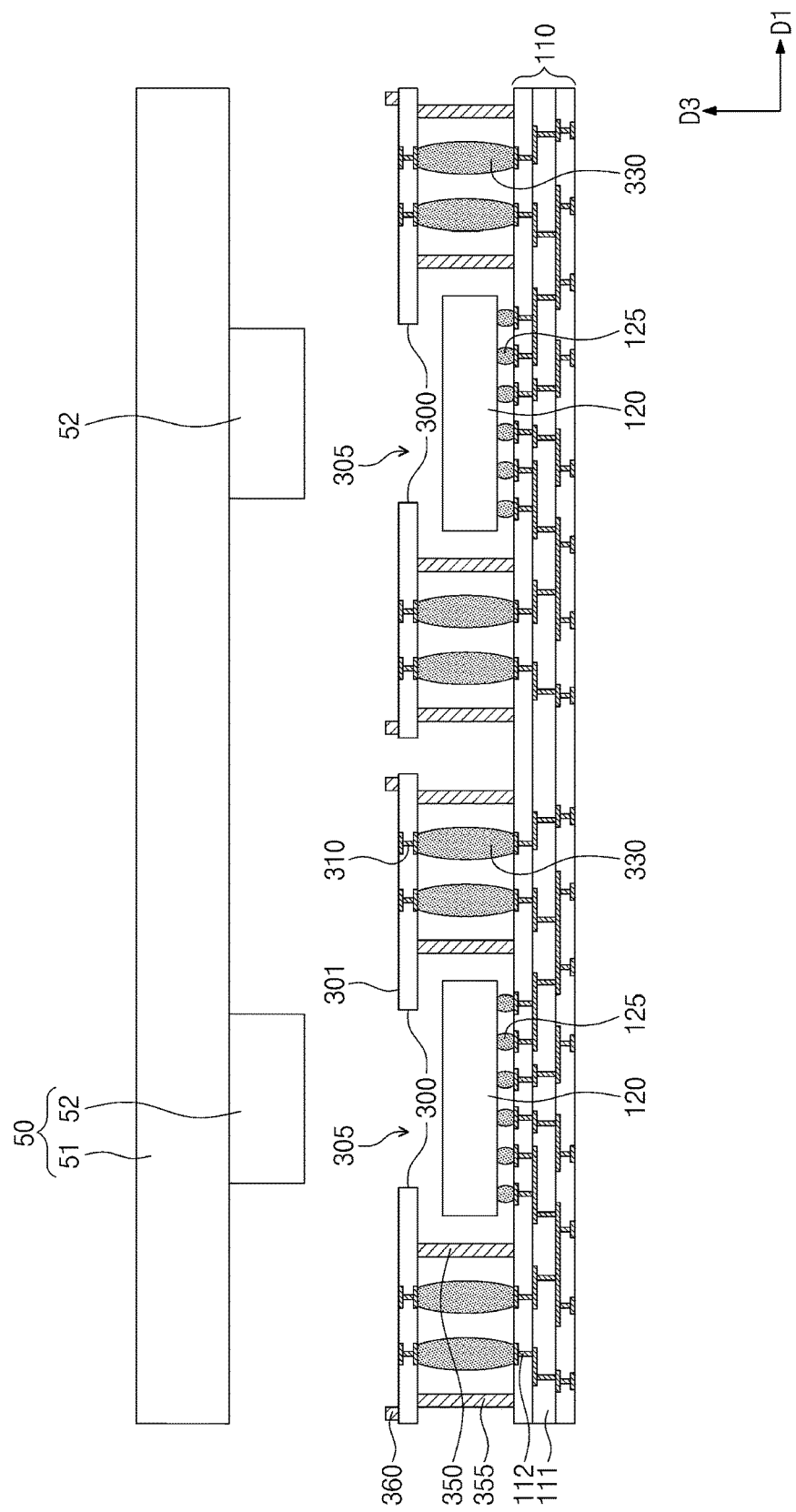

Referring to FIG. 13, a mold 50 may be positioned over the top surface 301 of the interposer substrate 300. The mold 50 may be spaced apart from the top surface 301 of the interposer substrate 300. The mold 50 may include a main plate 51 and a plurality of protrusions 52. The protrusions 52 may be vertically aligned with the substrate openings 305. In some embodiments, the mold 50 may be positioned such that a center point of each protrusion 52 is aligned with a center point of a corresponding one of the substrate openings 305. The protrusions 52 may be vertically overlap the lower semiconductor chips 120 and/or the substrate openings 305. Each of the protrusions 52 may protrude in a direction from the main plate 51 toward the substrate opening 305.

Figure 14:
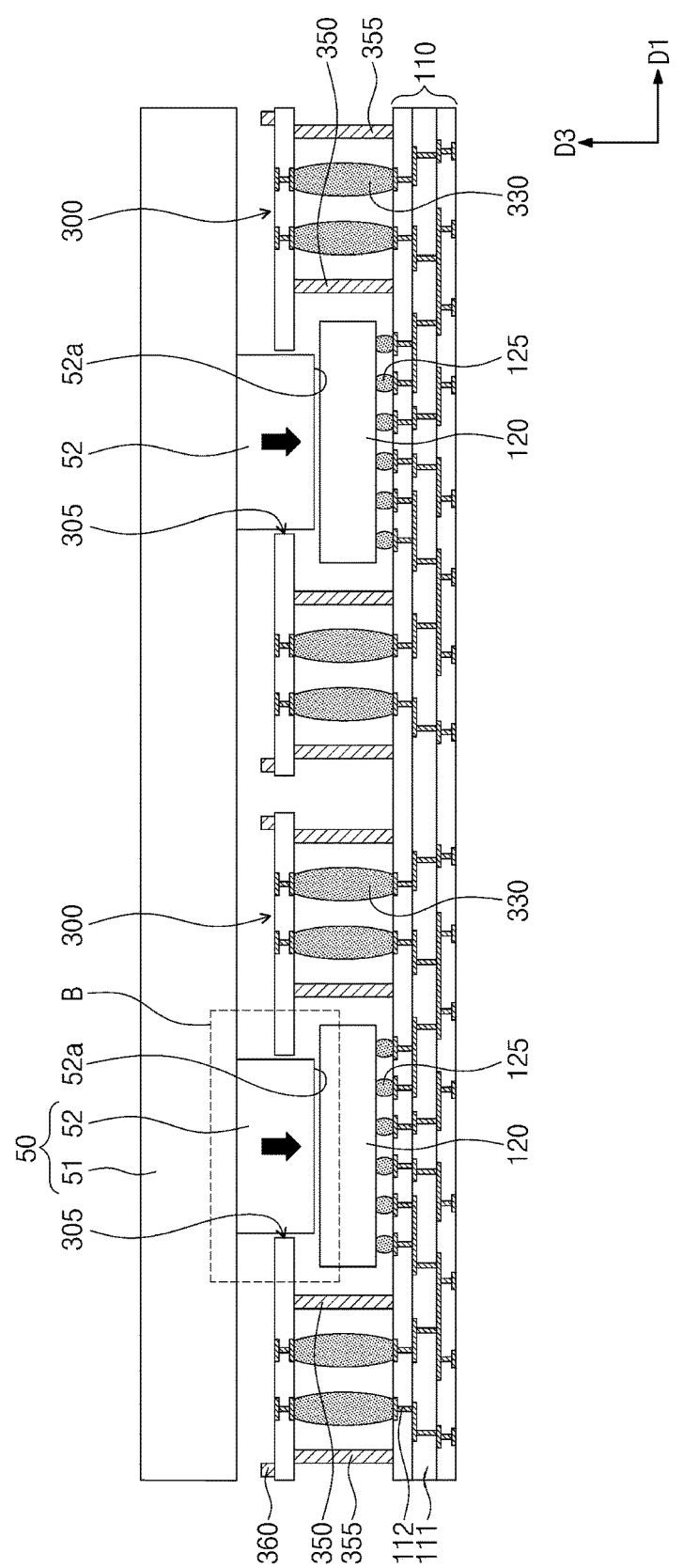
Figure 18:
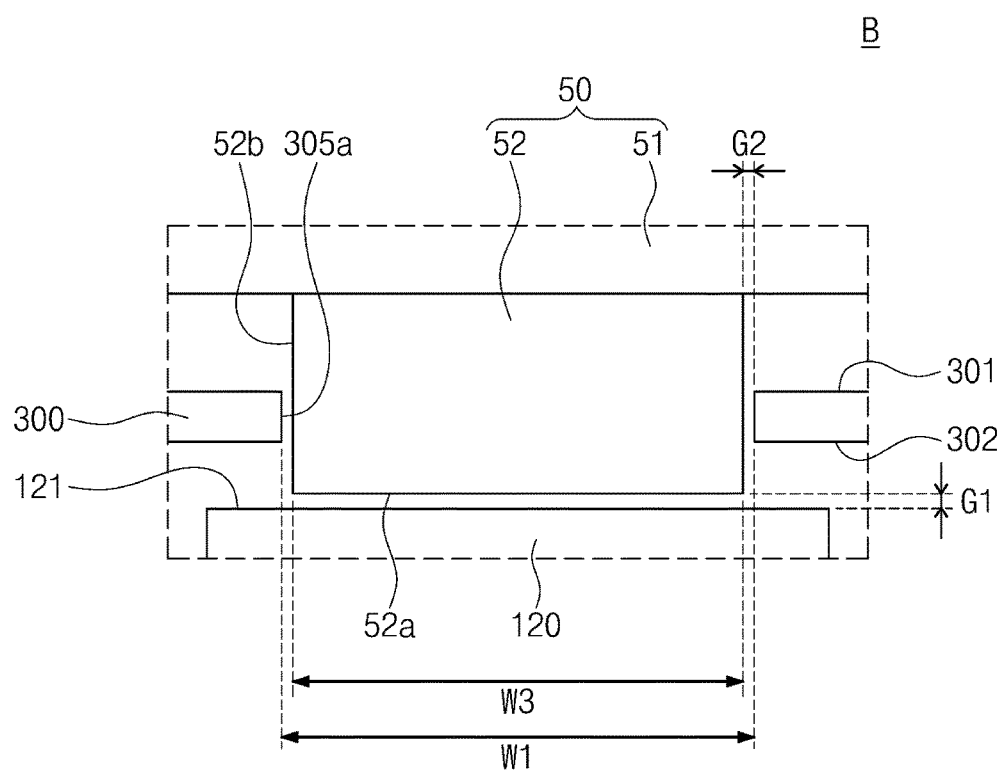
FIG. 18 illustrates an enlarged view showing section B of FIG. 14.

Referring to FIGS. 14 and 18, the mold 50 may move toward the interposer substrate 300. For example, the mold 50 may move in a direction reverse to the third direction D3. In this case, the protrusions 52 may be inserted into corresponding substrate openings 305. For example, the substrate opening 305 may receive the protrusion 52 to cause a bottom end 52a of the protrusion 52 to pass through the substrate opening 305. In an embodiment, the bottom end 52a of the protrusion 52 may be positioned at a vertical level between the bottom surface 302 of the interposer substrate 300 and a top surface 121 of the lower semiconductor chip 120. The bottom end 52a of the protrusion 52 may be at a lower vertical level than the bottom surface 302 of the interposer substrate 300 and at a higher vertical level than the top surface 121 of the lower semiconductor chip 120. For example, the bottom end 52a of the protrusion 52 may be downwardly spaced apart from the bottom surface 302 of the interposer substrate 300 and upwardly spaced apart from the top surface 121 of the lower semiconductor chip 120. A first gap G1 may be created between the bottom end 52a of the protrusion 52 and the top surface 121 of the lower semiconductor chip 120. In other embodiments, the bottom end 52a of the protrusion 52 may be in contact with the top surface 121 of the lower semiconductor chip 120. In this case, the first gap G1 may not be created.

In an embodiment, the protrusion 52 may have a width W3 less than a width W1 of the substrate opening 305. The protrusion 52 may be positioned in the substrate opening 305, when viewed in a plan view. For example, under a state that the protrusion 52 is inserted in the substrate opening 305, a sidewall 52b of the protrusion 52 may be spaced apart from a sidewall 305a of the substrate opening 305. As a result, the interposer substrate 300 may not interfere with the insertion of the protrusion 52 into the substrate opening 305. A second gap G2 may be created between the sidewall 52b of the protrusion 52 and the sidewall 305a of the substrate opening 305. In other embodiments, the width W3 of the protrusion 52 may be substantially the same as the width W1 of the substrate opening 305. In this case, the second gap G2 may not be created. Under a state that the protrusion 52 is inserted in the substrate opening 305, the top surface 301 of the interposer substrate 300 may be spaced apart from the main plate 51. For example, the main plate 51 may be at a higher vertical level than the top surface 301 of the interposer substrate 300.

Figure 15:
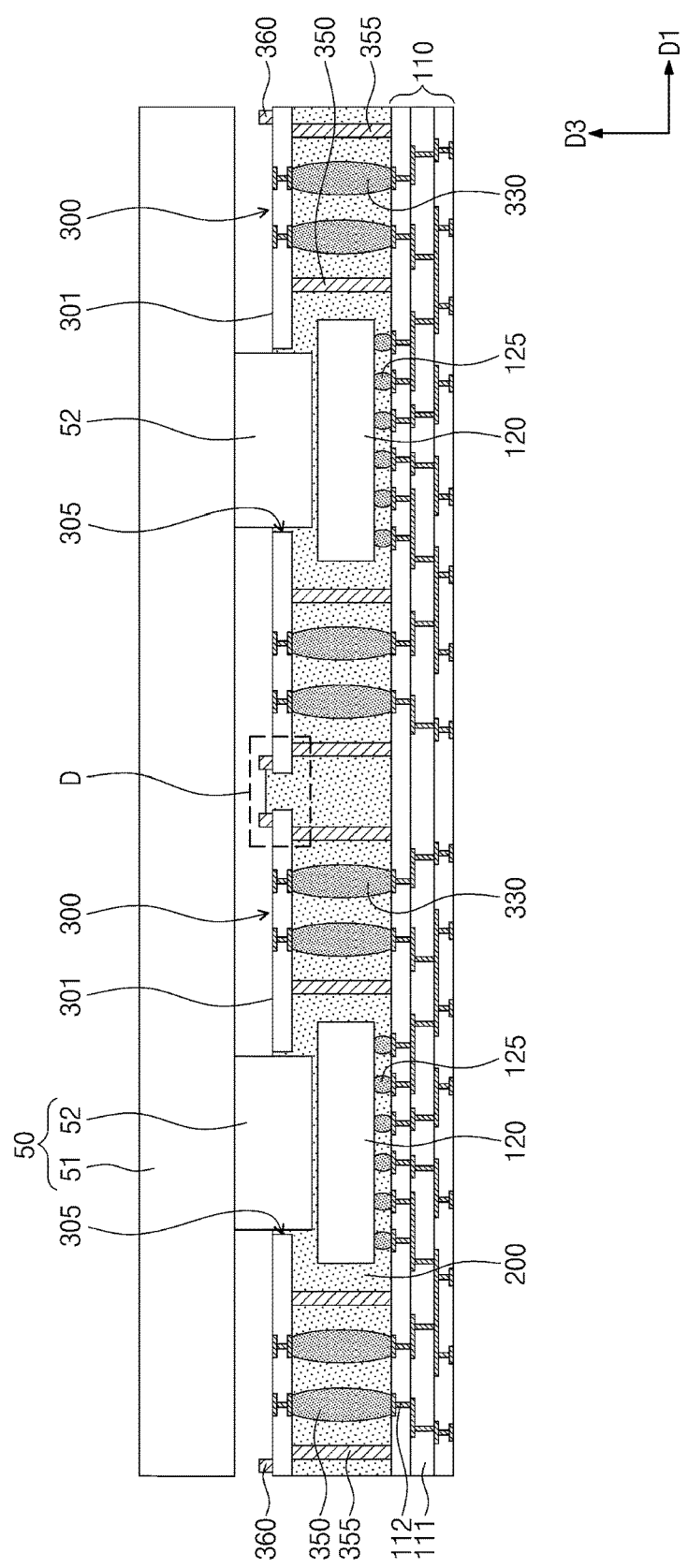

Referring to FIGS. 15 and 17, under a state that the protrusion 52 is inserted in the substrate opening 305, a molding material may be injected between the interposer substrate 300 and the lower substrate 110. The injection of the molding material may form a lower molding layer 200 between the lower substrate 110 and the interposer substrate 300. In an embodiment, the molding material may include but not limited to an insulating polymer material such as an epoxy molding compound.

The injected molding material may flow into a space between the first lower supporters 350, between the lower conductive connections 330, and between the second lower supporters 355. The molding material may fill spaces between and among the first lower supporters 350, the lower conductive connections 330, and the second lower supporters 355. The molding material may fill a space between the interposer substrate 300 and the lower substrate 110. The molding material may flow into the first gap G1. The lower molding layer 200 may thus be formed thin on a portion of the top surface 121 of the lower semiconductor chip 120. The molding material may flow into the second gap G2. The lower molding layer 200 may therefore be provided on the sidewall 305a of the substrate opening 305. The molding material may at least partially cover the bottom end 52a and the sidewall 52b of the protrusion 52. Consequently, the lower molding layer 200 may have a molding cavity 250, as discussed further below with reference to FIG. 16.

The molding material may flow into a separation space between the interposer substrates 300 spaced apart from each other. FIG. 15 shows a dotted line area D wherein the separation space is positioned. It may be that the interposer substrate 300 is provided on its top surface 301 with the molding material that flows into the separation space. For example, the molding material may rise to a vertical level that is higher than the top surface 301 of the interposer substrate 300. However, the barrier 360 may prevent the molding material from flowing onto the top surface 301 of the interposer substrate 300. For example, the top surface of the molding material may be at a higher vertical level than the top surface 301 of the interposer substrate 300, but at a lower vertical level than the top surface of the barrier 360. The barrier 360 may form a lip or rim over which the molding material cannot flow. Accordingly, the molding material may be prevented from covering the top surface 301 of the interposer substrate 300.

The molding material may flow between the lower semiconductor chip 120 and the lower substrate 110 to thereby fill a space between the lower semiconductor chip 120 and the lower substrate 110. The molding material may fill a space between and among the first contact terminals 125. When a large amount of the molding material flows into the space between the lower semiconductor chip 120 and the lower substrate 110, the lower semiconductor chip 120 may be provided with a force that raises the lower semiconductor chip 120 toward the interposer substrate 300 and away from the lower substrate 110. When the force acts on the lower semiconductor chip 120, the first contact terminals 125 may be physically separated from the lower semiconductor chip 120 and/or the lower substrate 110 such that the lower semiconductor chip 120 may be electrically disconnected from the lower substrate 110.

The force may be provided to the protrusion 52 through the lower molding layer 200 formed in the first gap G1. However, the protrusion 52 may provide the lower semiconductor chip 120 with an opposite force corresponding to the force. The force may then be counterbalanced by the opposite force. As the force is counterbalanced by the opposite force, the first contact terminals 125 may be prevented from being physically separated and/or electrically disconnected from the lower semiconductor chip 120 and/or the lower substrate 110.

Figure 16:
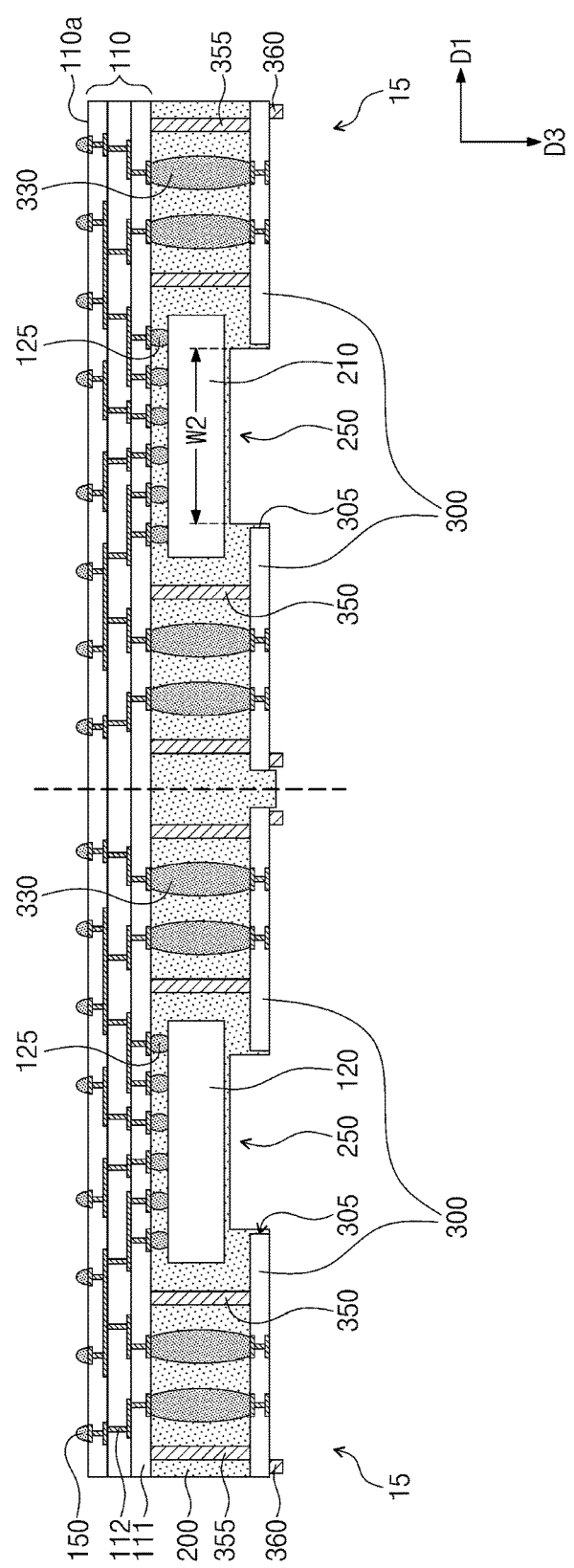
Figure 17:
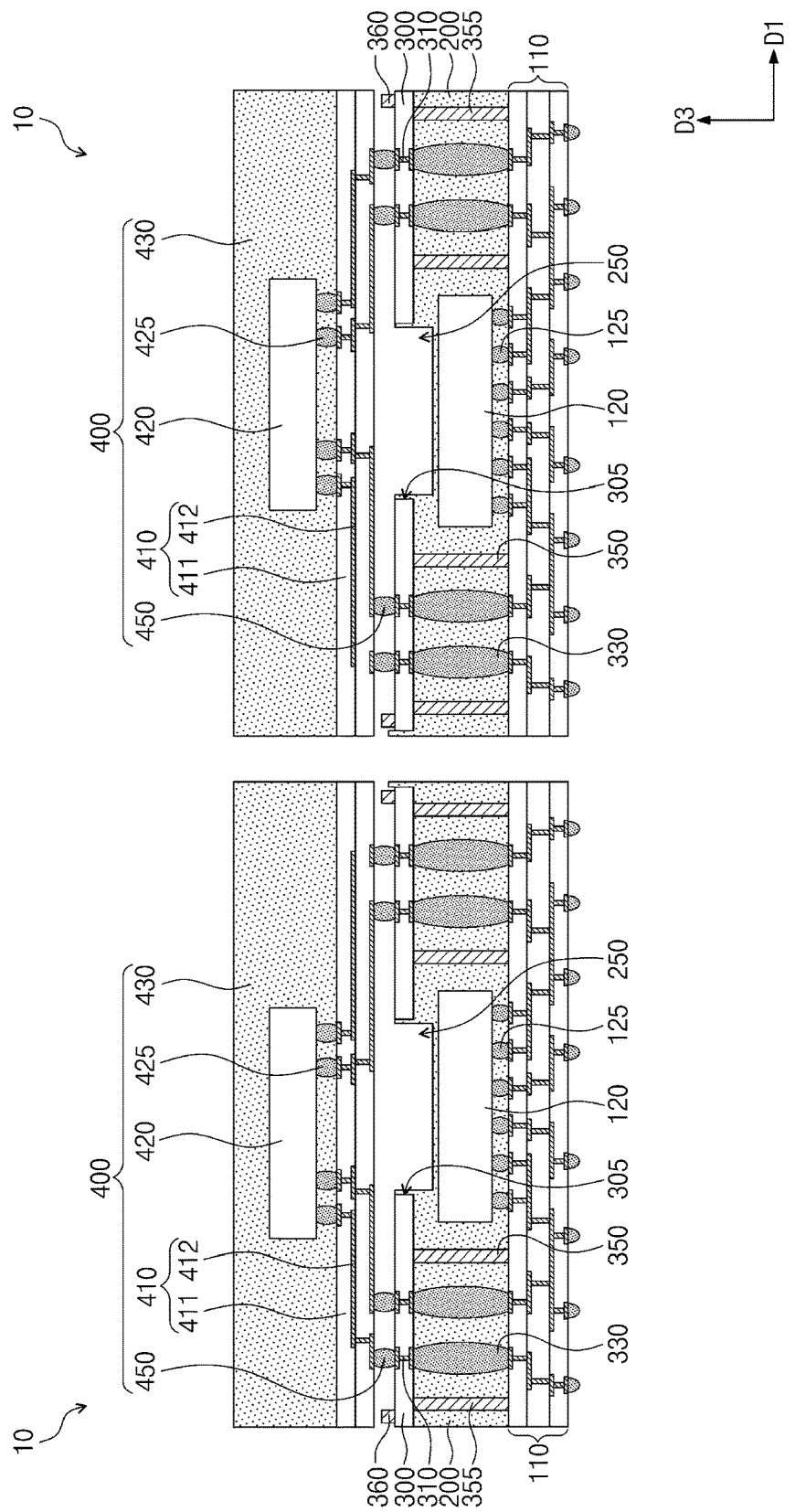

Referring to FIG. 16, the protrusion (see 52 of FIG. 15) of the mold (see 50 of FIG. 15) may be released from the substrate opening 305. A molding cavity 250 may appear when the protrusion 52 is released from the substrate opening 305. The lower substrate 110 may be turned upside down after the protrusion 52 of the mold 50 is released from the substrate opening 305. For example, the lower substrate 110 may rotated such that the bottom surface 110a of the lower substrate 110 is facing a direction opposite that of the original direction it faced. The molding cavity 250 may overlap the substrate opening 305. The molding cavity 250 may have a width W2 substantially the same as the width W3 of the protrusion 52 discussed above with reference to FIGS. 14 and 17.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

In an embodiment, a plurality of external terminals 150 may be formed on a bottom surface 110a of the lower substrate 110 that has been turned upside down. The external terminals 150 may be electrically connected to the redistributed conductive patterns 112. Some of the external terminals 150 may vertically overlap the lower semiconductor chips 120. The rest of the external terminals 150 may not vertically overlap the lower semiconductor chips 120. For example, a semiconductor package (10 of FIG. 2) may be a fan-out package. In other embodiments, after an upper package (see 400 of FIG. 2) is mounted on the interposer substrate 300 or before the lower molding layer 200 is formed, the external terminals 150 may be formed on the bottom surface 110a of the lower substrate 110.

A singulation process may be performed to cut the lower substrate 110 and the lower molding layer 200 along a dashed vertical line, as illustrated in FIG. 16. The singulation process may provide preliminary semiconductor packages 15 separated from each other.

Referring back to FIG. 2, the preliminary semiconductor packages (see 15 of FIG. 16) may be turned upside down. For example, the preliminary semiconductor packages 15 may be rotated such that the bottom surface 110a of the lower substrate 110 is facing the original direction. Upper packages 400 may be mounted on the preliminary semiconductor packages 15 that have been turned upside down. For example, an upper conductive connection 450 provided on a bottom surface of an upper substrate 410 may be vertically aligned with the redistributed conductive pattern 310 of the interposer substrate 300. In this step, the barrier 360 may be used to align the upper conductive connection 450 with the redistributed conductive pattern 310 of the interposer substrate 300.

The aligned upper conductive connection 450 may be electrically connected to the redistributed conductive patterns 310 of the interposer substrate 300. A reflow process may be employed to electrically connect the upper conductive connection 450 to the redistributed conductive patterns 310 of the interposer substrate 300. The upper conductive connection 450 may not overlap the molding cavity 250. Through the processes mentioned above, a plurality of semiconductor packages 10 may be fabricated to include a substantially hollow space, or the molding cavity 250.

According to exemplary embodiments, the molding cavity overlapping the lower semiconductor chip may be formed on the lower molding layer between the interposer substrate and the lower substrate. The molding cavity may increase efficiency of heat dissipation from the lower semiconductor chip.

The mold may be employed to form the molding cavity. When the lower molding layer is formed, the mold may prevent the lower semiconductor chip from being separated from the lower substrate.

The lower supporters may be formed between the lower substrate and the interposer substrate to thereby prevent failure of the lower conductive connection. Consequently, the semiconductor package may enhance in reliability and durability.

Effects of the present disclosure are not limited to the mentioned above, other effects which have not been mentioned above will be clearly understood to those skilled in the art from the following description.

Although the present disclosure has been described in connection with the embodiments of the present concepts illustrated in the accompanying drawings, it will be understood by one of ordinary skill in the art that variations in form and detail may be made therein without departing from the spirit and essential features of the disclosure. The above disclosed embodiments should thus be considered illustrative and not restrictive.

What is claimed is:

1. A semiconductor package, comprising:
   a lower semiconductor chip on a lower substrate;
   a lower molding layer covering the lower semiconductor chip on the lower substrate, the lower molding layer including a molding cavity that vertically overlaps the lower semiconductor chip and extends toward the lower semiconductor chip from a top surface of the lower molding layer;
   an interposer substrate on the top surface of the lower molding layer, the interposer substrate including a substrate opening that penetrates the interposer substrate and overlaps the molding cavity; and
   an upper package on the interposer substrate,
   wherein the molding cavity has a floor surface spaced apart from the upper package and extending across a substantially hollow space.

2. The semiconductor package of claim 1, further comprising:
   a first lower supporter;
   a second lower supporter; and
   a lower conductive connection,
   wherein the first lower supporter, the second lower supporter, and the lower conductive connection are disposed in the lower molding layer and connect the lower substrate and the interposer substrate to each other.

3. The semiconductor package of claim 2,
   wherein the first lower supporter is positioned between the lower semiconductor chip and the lower conductive connection, and
   wherein the lower conductive connection is positioned between the first lower supporter and the second lower supporter.

4. The semiconductor package of claim 2, wherein the first and second lower supporters comprise an epoxy material.

5. The semiconductor package of claim 1, wherein the lower molding layer completely covers a top surface of the lower semiconductor chip.

6. The semiconductor package of claim 1, wherein the molding cavity exposes the lower semiconductor chip.

7. The semiconductor package of claim 1, further comprising:
   a barrier on the interposer substrate.

8. The semiconductor package of claim 7, wherein the barrier extends along an edge of the interposer substrate.

9. The semiconductor package of claim 1, wherein the substrate opening and the molding cavity are provided in a circular or polygonal shape, when viewed in a plan view.

10. The semiconductor package of claim 1, wherein the lower molding layer extends onto a sidewall of the substrate opening.

11. A semiconductor package, comprising:
    a lower semiconductor chip on a lower substrate;
    a lower molding layer covering the lower semiconductor chip on the lower substrate, the lower molding layer including a molding cavity that extends toward the lower semiconductor chip from a top surface of the lower molding layer; and
    an interposer substrate on the lower molding layer, the interposer substrate including a substrate opening that penetrates the interposer substrate and overlaps the molding cavity,
    wherein the molding cavity has a floor surface spaced apart from the lower semiconductor chip.

12. A method of fabricating a semiconductor package, the method comprising:

mounting at least one lower semiconductor chip on a lower substrate;

forming on the lower semiconductor chip an interposer substrate including a substrate opening that exposes the lower semiconductor chip;

placing on the interposer substrate a mold including a protrusion that protrudes in a direction toward the substrate opening; and forming a lower molding layer between the lower substrate and the interposer substrate.

13. The method of claim 12, wherein forming the lower molding layer comprises:

inserting the protrusion into the substrate opening to cause a bottom end of the protrusion to pass through the substrate opening; and injecting a molding material between the interposer substrate and the lower substrate when the protrusion is inserted in the substrate opening.

14. The method of claim 13, wherein inserting the protrusion into the substrate opening comprises:

placing the bottom end of the protrusion at a vertical level between a bottom surface of the interposer substrate and a top surface of the lower semiconductor chip.

15. The method of claim 13, wherein inserting the protrusion into the substrate opening comprises:

contacting the bottom end of the protrusion with the lower semiconductor chip.

16. The method of claim 13, wherein, when the protrusion is inserted in the substrate opening, a sidewall of the protrusion is spaced apart from a sidewall of the substrate opening.

17. The method of claim 12, further comprising:

forming a lower conductive connection between the lower substrate and the interposer substrate, the lower conductive connection electrically connecting the lower substrate and the interposer substrate to each other, wherein forming the lower conductive connection comprises:

vertically aligning upper connection terminals provided on a bottom surface of the interposer substrate with lower connection terminals provided on a top surface of the lower substrate; and moving at least one of the interposer substrate and the lower substrate to contact the lower connection terminals and the upper connection terminals with each other.

18. The method of claim 17, further comprising, when moving the at least one of the interposer substrate and the lower substrate:

contacting the lower substrate with a first lower supporter provided on the bottom surface of the interposer substrate.

19. The method of claim 18, wherein the first lower supporter comprises an epoxy material.

20. The method of claim 12, further comprising:

mounting an upper package on the interposer substrate.

* * * * *